United States Patent [19]
Yang et al.

[11] Patent Number: 5,792,689
[45] Date of Patent: Aug. 11, 1998

[54] METHOD FOR MANUFACTURING DOUBLE-CROWN CAPACITORS SELF-ALIGNED TO NODE CONTACTS ON DYNAMIC RANDOM ACCESS MEMORY

[75] Inventors: Fu-Liang Yang, Tainan; Erik S. Jeng, Taipei, both of Taiwan

[73] Assignee: Vanguard International Semiconductor Corporation, Hsin-Chu, Taiwan

[21] Appl. No.: 827,817

[22] Filed: Apr. 11, 1997

[51] Int. Cl.$^6$ .............................. H01L 21/8242
[52] U.S. Cl. .................. 438/253; 438/254; 438/255
[58] Field of Search ........................ 438/238–240, 438/253–255, 381, 396–398; 257/296, 306, 308, 309, 310

[56] References Cited

U.S. PATENT DOCUMENTS

| | | | |
|---|---|---|---|
| 5,082,797 | 1/1992 | Chen et al. | 438/255 |
| 5,185,282 | 2/1993 | Lee et al. | 437/47 |
| 5,281,549 | 1/1994 | Fazan et al. | 438/254 |
| 5,554,557 | 9/1996 | Koh | 437/52 |

*Primary Examiner*—Joni Chang
*Attorney, Agent, or Firm*—George O. Saile; Stephen B. Ackerman

[57] ABSTRACT

A method is described using a single photoresist mask to make a double-crown-shaped DRAM capacitor self-aligned to the capacitor node contact. After forming the DRAM FETs and the bit lines, a planar BPSG layer, a first polysilicon layer, and a CVD oxide layer are deposited. A node contact photoresist mask is used to form first openings in the CVD oxide in which silicon nitride sidewall spacers are formed. A smaller second opening is etched in the first opening to form node contact openings to the DRAM FET source/drain areas. A conformal second polysilicon layer is deposited to form node contacts in the second openings and over the free-standing sidewall spacers. A planar spin-on glass layer is then used as a self-aligned mask to etch back to expose the second polysilicon layer, which is then removed from the top of the sidewall spacers. After removing the spin-on glass an anisotropic etch is used to form the double-crown-shaped capacitor bottom electrodes self-aligned to the node contacts. The bottom electrode surface is roughened to increase the capacitance area, and the sidewall spacers are removed. An interelectrode dielectric layer and a third polysilicon layer are used to complete the double-crown-shaped stacked capacitors.

20 Claims, 4 Drawing Sheets

5,792,689

1

METHOD FOR MANUFACTURING DOUBLE-CROWN CAPACITORS SELF-ALIGNED TO NODE CONTACTS ON DYNAMIC RANDOM ACCESS MEMORY

BACKGROUND OF THE INVENTION

(1) Field of the invention

This invention relates to an integrated circuit semiconductor device, and more particularly to a method for fabricating double-crown-shaped stacked capacitors for dynamic random access memory (DRAM) which are self-aligned to the capacitor node contacts. A single photoresist masking step is used to form the node contacts and the double-crown capacitors thereby simplifying the processing steps in the photolithography and reducing the manufacturing cost.

(2) Description of the Prior Art

Ultra large scale integration (ULSI) semiconductor technologies have dramatically increased the integrated circuit density on the chips formed on the semiconductor substrate. This increase in circuit density has resulted from downsizing of the individual devices and the resulting increase in device packing density. The reduction in device size was achieved predominantly by recent advances in high resolution photolithography, directional (anisotropic) plasma etching, and other semiconductor technology innovations. However, future requirements for even greater circuit density is putting additional demand on the semiconductor processing technologies and on device electrical requirements.

One integrated circuit type experiencing this demand for increased density is the dynamic random access memory (DRAM) circuit, used extensively in the electronics industry for information storage. The circuit on the DRAM chip consists of an array of individual DRAM storage cells that store data or information as electrical charge on a capacitor and are accessed by peripheral address and read/write circuits on the chip. The individual DRAM storage cells consist of a single field effect transistor (FET) (pass transistor) and a single capacitor for storing charge which is used to represent a bit of binary data or information. By the year 2001 the bit count on the DRAM chip is expected to exceed 1 Gigabits.

With this rapid increase in the number of cells on the DRAM chip and the corresponding decrease in physical size of the capacitor, it is becoming increasingly difficult to store sufficient charge on the storage capacitor to maintain an acceptable signal-to-noise level. If the amount of charge on the capacitor decreases, then these volatile storage cells also require more frequent refresh cycles to restore the charge on the capacitor.

Since the storage capacitor must occupy an area limited by the cell size, in order to accommodate the array of capacitors on the chip it is necessary to explore alternative methods for increasing the capacitance without increasing the lateral area that the capacitor occupies on the substrate surface. Both trench capacitors formed in the substrate and stacked capacitors built over the FETs are common methods of building DRAM cells. In recent years the difficulty in fabricating trenches with increased capacitor area, hence increased capacitance, has directed one to the fabrication of stacked capacitors which can be built extending vertically over each memory cell area. This allows one more latitude in designing the capacitor but, in general, also makes the process more complex and costly.

Numerous methods have been reported in the literature for increasing capacitance of stacked capacitors, but generally require additional processing steps that increase DRAM cost. One method of forming an array of stacked capacitors with increased capacitance for DRAM devices is taught by Koh, U.S. Pat. No. 5,554,557, in which a single-crown capacitor is formed self-aligned to the capacitor node contact using polysilicon sidewall spacers on which is formed the stacked capacitor bottom electrode. Another method of forming stacked capacitors with increased capacitance is described by Lee et al. in U.S. Pat. No. 5,185,282, in which a method is taught for fabricating the bottom electrode for a cup-shaped stacked capacitor with a double sidewall using a sidewall spacer and two polysilicon depositions.

There is still a strong need in the semiconductor industry to further increase the capacitance of the stacked capacitors for DRAM cells with a reduced number of processing steps and photoresist masking levels. More specifically, it is desirable to self-align the bottom electrode of the capacitor to the node contact using a single polysilicon deposition to reduce interface contact concerns and minimize photoresist masking levels.

SUMMARY OF THE INVENTION

Accordingly, it is a principal object of this invention to provide a method for fabricating an array of double-crown-shaped stacked capacitors with increased capacitance.

It is another object of this invention to provide a method for making the bottom electrodes for capacitors self-aligned to the node contacts using a single photoresist masking step, thereby improving DRAM cell density and simplifying the process steps in photolithography, which provide a more cost-effective manufacturing process.

The above objectives are achieved by providing a method of manufacturing an array DRAM cells with double-crown-shaped stacked storage capacitors. The method employs a single mask for making the bottom electrodes self-aligned to the node contacts.

The method begins by providing an array of device areas on a semiconductor substrate, such as on a single crystal silicon substrate doped with a P-type conductive dopant (e.g., boron). A relatively thick Field OXide (FOX) is formed on and in the silicon substrate to surround and electrically isolate each device area. One method of forming the FOX areas is to deposit and pattern a silicon nitride ($Si_3N_4$) layer over the desired device areas, which prevents thermal oxidation. The exposed field oxide areas are then thermally oxidized on the silicon substrate to form the FOX. This method is typically referred to in the semiconductor industry as the LOCal Oxidation of Silicon (LOCOS). After removing the silicon nitride layer, a thin gate oxide is formed on the silicon substrate in the device areas, and a first polycide layer, having a cap insulating layer composed of silicon nitride and silicon oxide ($Si_3N_4/SiO_2$), is patterned to form the FET gate electrodes in the device areas and the interconnecting word lines over the FOX. Lightly doped source/drain areas are formed adjacent to the gate electrodes, usually by ion implantation of an N-type dopant such as arsenic (As) or phosphorus (P), and then sidewall spacers are formed, usually by depositing an insulator such as silicon nitride ($Si_3N_4$) or silicon oxide ($SiO_2$), and anisotropically etching back to the substrate surface. Typically these N-channel FETs are then completed by using a second N-type dopant implant to form the FET first and second source/drain contact areas adjacent to each side of the gate electrode. A planar first insulating layer composed of a tetraethosiloxane (TEOS) oxide layer and an upper borophosphosilicate glass (BPSG) is now deposited on the substrate by chemical vapor deposition (CVD). The BPSG is then etched back to form a planar surface. A photoresist mask and anisotropic etching are used to etch contact openings in the first insulating layer to the first source/drain contact area of each FET to provide bit line contact openings. A second polycide layer is deposited with a cap oxide composed of $Si_3N_4/SiO_2$, and patterned to form bit lines making electrical contact to the first source/drain contact areas in the bit line contact openings. A second insulating layer composed of BPSG is deposited and planarized over the substrate to electrically isolate the bit lines. Next, a first polysilicon layer and a third insulating layer are deposited sequentially on the planar second insulating layer. Using conventional photolithographic techniques and anisotropic plasma etching, first openings are etched in the third insulating layer to the surface of the first polysilicon layer, and the openings are aligned over the second source/drain contact areas. These openings provide a means for forming concurrently the capacitor bottom electrodes and the capacitor node contacts, self-aligned to each other. A conformal fourth insulating layer composed of $Si_3N_4$ is deposited by low pressure chemical vapor deposition (LPCVD) and anisotropically etched back to form sidewall spacers on the sidewalls of the first openings. This results in second openings with decreased width and will eventually provide small node contact openings that can exceed the photoresist resolution limit and prevent the node contact openings from overlapping the gate electrodes that would otherwise cause shorts. Continuing, the exposed first polysilicon layer in the second openings is etched to the surface of the second insulating layer. The second openings, self-aligned to the sidewall spacers of the first openings, are now anisotropically plasma etched in the second and first insulating layers to the second source/drain contact areas thereby providing node contact openings. Concurrently the remaining third insulating layer is etched to the first polysilicon layer, the first polysilicon layer serving as an etch-stop layer over the bit lines and elsewhere on the substrate. A conformal second polysilicon layer is deposited over the free-standing sidewall spacers and in the second openings to form node contacts and portions of the bottom electrodes. A spin-on glass layer having a planar surface is deposited and etched back exposing portions of the second polysilicon layer on the top portions of the sidewall spacers. The second polysilicon layer is then etched back to expose the top of the sidewall spacers. The spin-on glass is now selectively removed exposing the remaining second polysilicon layer that forms the bottom electrodes. A selective anisotropic plasma etch is carried out to remove the second and first polysilicon layers between adjacent capacitor bottom electrodes, thereby forming an array of electrically isolated bottom electrodes. The surface of the exposed second polysilicon layer that forms the bottom electrodes can be further increased by roughening, for example, by depositing and etching back a hemispherical silicon grain (HSG) layer. The silicon nitride sidewall spacers are removed, for example by etching in hot phosphoric acid, while leaving essentially unetched the exposed BPSG second insulating layer, completing the bottom electrodes for the capacitors having a double-crown shape. The capacitors are now completed by forming a thin interelectrode dielectric layer, such as silicon oxide/silicon nitride/silicon oxide (ONO) on the bottom electrodes. A third polysilicon layer is deposited and patterned to form the top electrodes to complete double-crown-shaped stacked capacitors having increased capacitance.

BRIEF DESCRIPTION OF THE DRAWINGS

The objects and advantages of this invention are best understood by the detailed embodiment with reference to the attached drawings in the figures that follow.

DESCRIPTION OF THE PREFERRED EMBODIMENT

Now in keeping with the objects of this invention, the method for forming an array of double-crown-shaped stacked capacitors self-aligned to capacitor node contacts using a single photoresist masking level and high-density anisotropic plasma etching is described in detail. These improved double-crown-shaped capacitors used on DRAM structures can be fabricated using N-channel FETs as the pass transistors that are currently used in manufacturing.

The DRAM structure is typically formed on a P-doped semiconductor substrate using N-channel field effect transistors (N-FET) as the pass transistors in each of the memory cells. It should also be well understood by one skilled in the art that by including additional process steps, in addition to those described in this embodiment, other types of devices can also be included on the DRAM chip. For example, by forming N-well regions in the P-doped substrate, both N- and P-channel FETs can also be provided for making Complementary Metal-Oxide-Semiconductor (CMOS) circuits, such as are used for the peripheral circuits on the DRAM chip.

Figure 1:
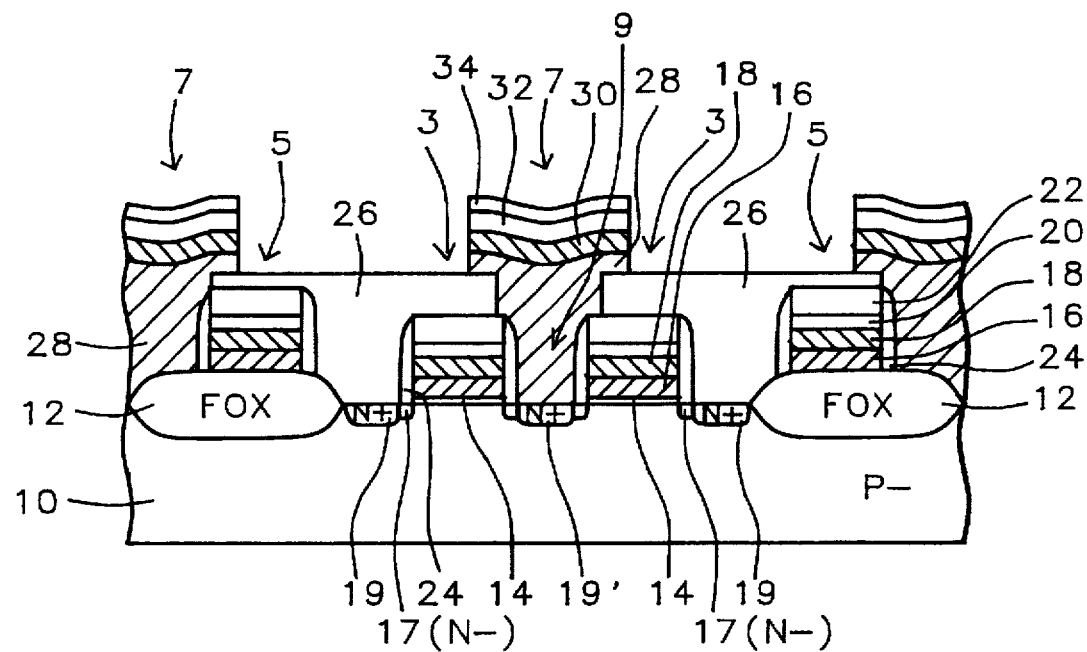
FIGS. 1 through 8 show schematic cross-sectional views for the sequence of processing steps used to fabricate a DRAM device, by the method of this invention, showing a portion of the memory cell region having two double-crown-shaped storage capacitors sharing a common bit line.

Referring to FIG. 1, a schematic cross-sectional view of a portion of a semiconductor substrate 10 is shown having partially completed DRAM cells showing two pass transistors (N-channel FETs) formed on and in the substrate surface. The preferred substrate is composed of a lightly doped P-type single crystal silicon having a <100> crystallographic orientation. A relatively thick Field OXide (FOX) 12 is formed surrounding and electrically isolating the individual device regions in which the memory cells are built. Portions of the field oxide 12 surrounding device regions are shown in FIG. 1. Although the details for forming the FOX are not depicted in the FIGS., the FOX is most commonly formed by the LOCal Oxidation of Silicon (LOCOS) method. This LOCOS method involves depositing a thin silicon oxide (pad oxide) to reduce stress, and a thicker silicon nitride ($Si_3N_4$) layer as an oxidation barrier layer on the substrate surface. Conventional photolithographic techniques and etching are used to remove the barrier layer in areas where the field oxide is desired, while the $Si_3N_4$ is retained in areas where active devices are to be fabricated. The silicon substrate 10 is then subjected to a thermal oxidation to form the field oxide areas 12. Generally the field oxide is grown to a thickness of between about 3000 and 6000 Angstroms. The silicon nitride barrier layer and the pad oxide layer are removed in respective wet etches of hot phosphoric acid ($H_3PO_4$) at about 180° C. and a dilute solution of hydrofluoric acid and water ($HF/H_2O$).

The N-channel FETs are now formed in the active device regions. These devices are formed by first thermally oxidizing the device areas to form a thin gate oxide 14. Typically, the thickness of the gate oxide 14 is between about 80 and 100 Angstroms. After further processing, only portions of the gate oxide 14 remain over the channel regions of the FET, as shown in FIG. 1.

Referring still to FIG. 1, conventional photolithographic techniques and plasma etching are used to form FET gate electrodes 3 in the device areas and word lines 5 over the FOX from a multilayer composed of a first polycide layer and a cap oxide layer. The polycide layer is composed of a polysilicon layer 16 and a refractory metal silicide layer 18 on its surface. The cap oxide layer is composed of a silicon oxide layer 20 and a silicon nitride layer 22. The first polysilicon layer 16 is deposited, for example, using low pressure chemical vapor deposition (LPCVD) and a reactant gas, such as silane ($SiH_4$). The polysilicon layer 16 is doped with an N-type conductive dopant, for example, by ion implantation with arsenic ions ($As^{75}$) or phosphorus ions ($p^{31}$). Typically the polysilicon layer 16 is between about 500 and 1500 Angstroms thick, and is doped to a concentration of between about 1.0 E 19 to 1.0 E 21 atoms/$cm^3$. The refractory metal silicide layer 18, such as tungsten silicide ($WSi_2$), is formed on the polysilicon layer 16 to increase the electrical conductivity. For example, a tungsten metal can be physically deposited and then sintered to form the silicide. The tungsten can also be deposited by chemical vapor deposition (CVD) using tungsten hexafluoride ($WF_6$) as the reactant gas. The cap oxide, usually composed of a $SiO_2$ layer 20 and a $Si_3N_4$ layer 22, can be deposited using LPCVD by decomposing a reactant gas, such a tetraethosiloxane (TEOS) to form the $SiO_2$, and a reactant gas of $SiCl_2H_2$ and ammonia ($NH_3$) to form the silicon nitride. The cap oxide is provided over the gate electrodes 3 and the word lines 5 to electrically insulate them from portions of the bit lines 7 that are formed later. Typically, the thickness of the cap oxide layer ($SiO_2/Si_3N_4$) is between about 1000 and 2000 Angstroms.

Lightly doped source/drain areas 17($N^-$) are formed next adjacent to the gate electrodes 3. The lightly doped source/drain areas for the N-FETs are formed by ion implantation of an N-type dopant such as arsenic or phosphorus. For example, a typical implant might consist of phosphorus $p^{31}$ at a dose of between 1.0 E 13 and 1.0 E 14 atoms/$cm^2$ and an energy of between about 30 and 80 KeV. The gate electrodes serve as an implant mask to self-align the source/drain to the electrode, while an additional photoresist mask can be used to avoid unwanted implants elsewhere on the substrate.

After forming the lightly doped source/drains 17($N^-$), sidewall spacers 24 are formed on the sidewalls of the gate electrodes 3, also shown in FIG. 1. These sidewall spacers are typically formed by depositing a low-temperature silicon oxide, and then anisotropically etching back to the silicon surface. For example, the silicon oxide can be deposited using LPCVD and tetraethoxysilane (TEOS) at a temperature in the range of about 650° to 900° C., and the etch back is performed in a low pressure reactive ion etcher (RIE). Alternatively, the spacers can be formed by depositing a silicon oxide layer followed by a silicon nitride layer similar to the deposition of the cap oxide, which is then etched back to form the sidewall spacers. An $N^+$ source/drain ion implantation is then used to complete the source/drain areas forming the $N^+$ doped source/drain contact areas 19($N^+$) and 19'($N^+$) aligned to the sidewall spacers 24, and therefore also aligned to the lightly doped source/drain areas 17($N^-$), as depicted in FIG. 1.

Still referring to FIG. 1, a first insulating layer 26 is deposited on the substrate 10 to electrically insulate the exposed source/drain contacts. The first insulating layer 26 is preferably a multilayer composed of an undoped LPCVD silicon oxide (e.g., TEOS oxide) and a boron- and phosphorus-doped borophosphosilicate glass (BPSG). The undoped TEOS oxide prevents unwanted dopant from diffusing into the substrate 10 from the BPSG during further thermal processing. The BPSG can be deposited, for example, by LPCVD using a reactant gas such as TEOS to which are added dopant gases such as phosphine ($PH_3$) and diborane ($B_2H_6$) to the TEOS gas flow during deposition. The BPSG is then planarized using etch-back techniques. The thickness of layer 26 over the gate electrodes is typically between about 1000 and 2000 Angstroms after planarization.

Still referring to FIG. 1, conventional photolithographic techniques and anisotropic plasma etching are used to form bit line contact openings 9 in layer 26 to the source/drain areas 19'. For example, the plasma etching can be carried out in a high-density plasma etcher using an etchant gas mixture, such as trifluoromethane ($CHF_3$), oxygen ($O_2$), and argon (Ar).

The bit lines 7 are formed next making contact to the source/drain areas 19'. The bit lines are formed from a patterned multilayer made up of a second polycide layer having a cap oxide composed of $SiO_2/Si_3N_4$, using a process similar to the formation of the gate electrodes. The second polycide layer is formed by depositing a polysilicon layer 28 which is doped $N^+$ and having a thickness of between about 1000 and 3000 Angstroms on which is deposited a tungsten silicide ($WSi_2$) layer 30 having a thickness of between about 1000 and 2000 Angstroms. The cap oxide layer is formed by depositing an LPCVD silicon oxide layer 32 and an LPCVD silicon nitride layer 34. The preferred thickness of the cap oxide layer ($SiO_2/Si_3N_4$) is between about 1000 and 2000 Angstroms.

Referring to FIGS. 2–8, the method of forming the double-crown-shaped stacked storage capacitors self-aligned to the node contacts is now described by the method of this invention.

Figure 2:
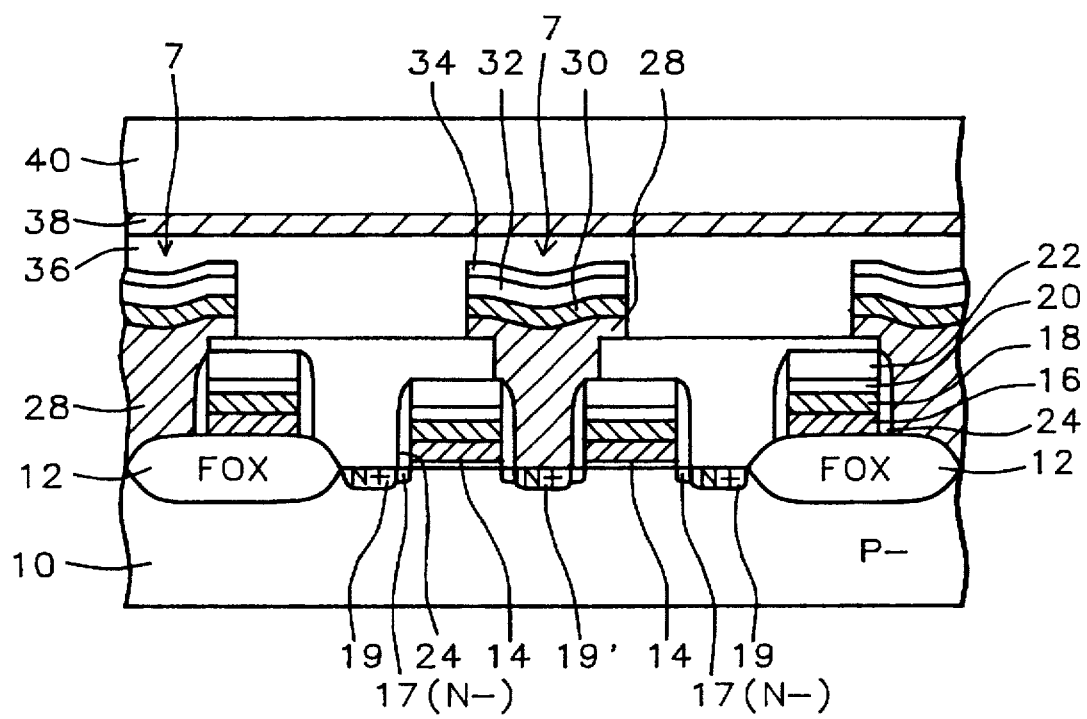

Referring to FIG. 2, a second insulating layer 36 composed of BPSG is deposited and planarized over the substrate and electrically isolates the bit lines 7 and the word lines 5. Preferably the BPSG is deposited by LPCVD using, for example, silane ($SiH_4$) as the reactant gas and dopant gases such as diborane hydride ($B_2H_6$) and phosphine ($PH_3$). Layer 36 is deposited to a thickness of between about 4000 and 9000 Angstroms. Layer 36 is then planarized by thermal annealing at a temperature of between about 800° and 900° C. for a time of between about 30 and 60 minutes.

Next, a first polysilicon layer 38 and a third insulating layer 40 are deposited sequentially on the planar second insulating layer 36. Preferably polysilicon layer 38 is deposited by LPCVD using $SiH_4$ and is doped $N^+$, such as with phosphorus ($p^{31}$) by ion implantation. The resulting dopant concentration in layer 38 is between about 1.0 E 19 and 1.0 E 21 atoms/$cm^3$. The thickness of layer 38 is between about 500 and 1500 Angstroms. Third insulating layer 40 is preferably composed of $SiO_2$, and is deposited by LPCVD using a reactant gas of TEOS. Layer 40 is deposited to a thickness of between about 4000 and 9000 Angstroms.

Figure 3:
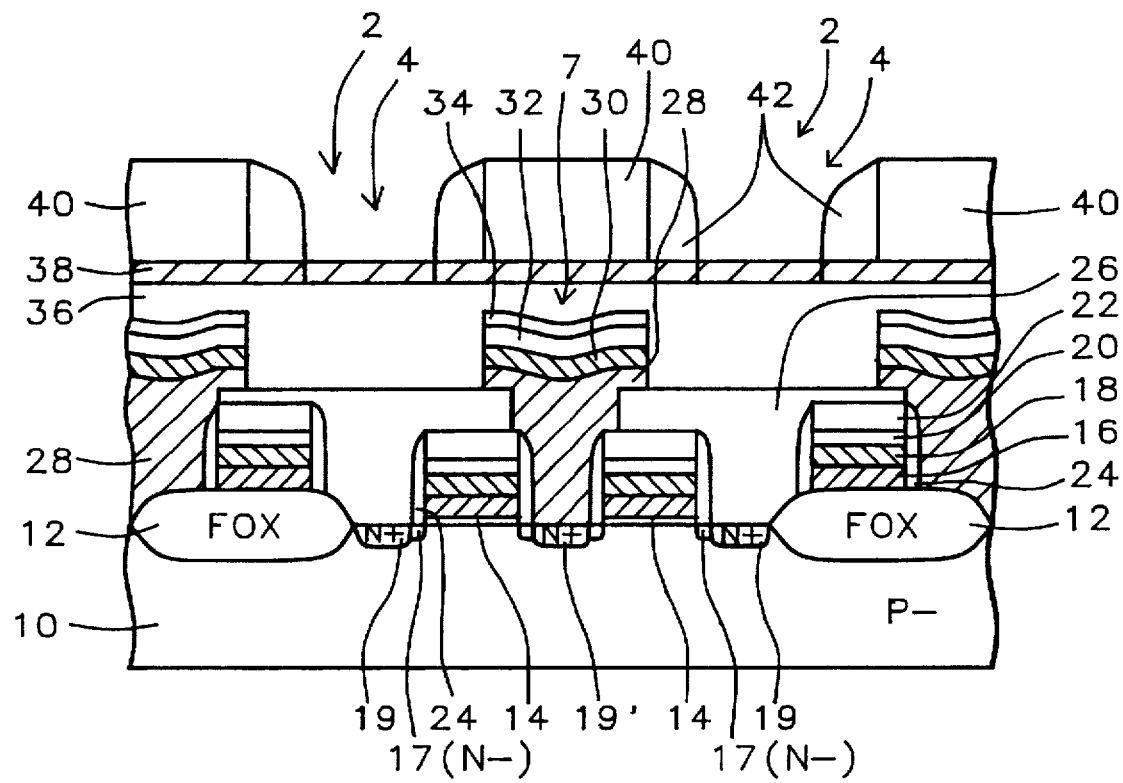

Referring now to FIG. 3, conventional photolithographic techniques and anisotropic plasma etching are used to etch first openings 2 in the third insulating layer 40 to the surface of the first polysilicon layer 38. These openings 2 are aligned over the second source/drain contact areas 19. The first openings are formed using the node contact photoresist mask, and provide a means for forming concurrently the bottom electrodes for the stacked capacitors and the capacitor node contacts which are self-aligned to each other. The first openings 2 are preferably etched using reactive ion etching or high-density plasma etching and an etchant gas mixture such as trifluoromethane ($CHF_3$), carbon tetrafluoride ($CF_4$), oxygen ($O_2$), and argon (Ar) which provides a high degree of etch selectivity between the TEOS oxide and silicon.

A conformal fourth insulating layer composed of $Si_3N_4$ having a thickness of between about 1000 and 2500 Å, is deposited, for example, by plasma enhanced CVD (PECVD) and is anisotropically etched back to form sidewall spacers 42 on the sidewalls of the first openings 2, as shown in FIG. 3. The sidewall spacers 42 are preferably formed having a width of between about 1000 and 2500 Angstroms. This further reduces the width of the first openings 2 to form second openings 4 which are now used to etch the node contact openings that can exceed the photoresist resolution limit and prevent the node contact openings from overlapping and electrically shorting to the FET gate electrodes. The exposed first polysilicon layer 38 in the second openings 4 is selectively etched to the surface of the second insulating layer 36. For example, reactive ion etching using a high selective etch gas containing chlorine ($Cl_2$) species can be used to etch layer 38.

Figure 4:
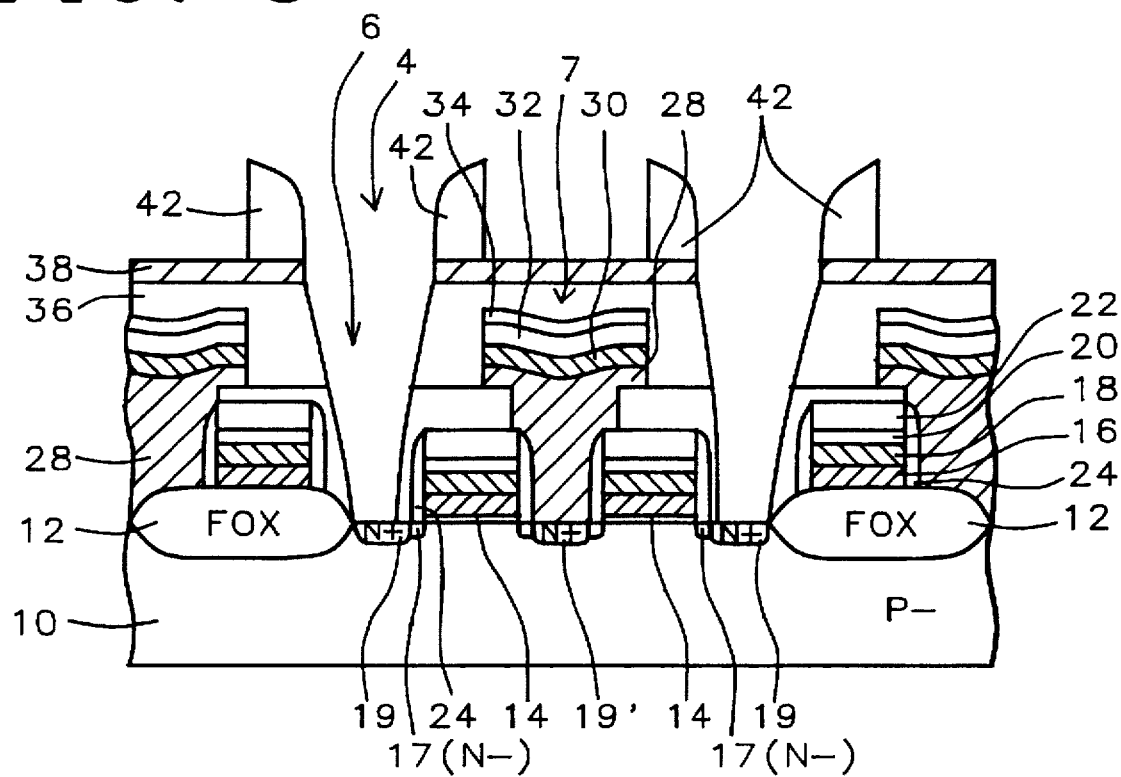

Referring to FIG. 4, node contact openings 6 to the second source/drain areas 19($N^+$) are formed by anisotropic plasma etching the second and first insulating layers (layers 36 and 26) in the second openings 4. The node contact openings are also self-aligned to the sidewall spacers 42. Concurrently the remaining third insulating layer 40 (shown in FIG. 3.) is etched to the first polysilicon layer 38. The anisotropic plasma etching is carried out in a high-density plasma etcher using a gas mixture of perfluoroisobutylene ($C_4F_8$) and carbon monoxide (CO) that has a high oxide etch rate selectivity to both the $Si_3N_4$ sidewall spacers 42 and the first polysilicon layer 38, resulting in the node contact openings self-aligned to the free-standing sidewall spacers 42, as shown in FIG. 4. The first polysilicon layer 38 serves as an etch-stop layer over the bit lines 7 and elsewhere on the substrate to prevent erosion of the underlying silicon oxide layers.

Figure 5:
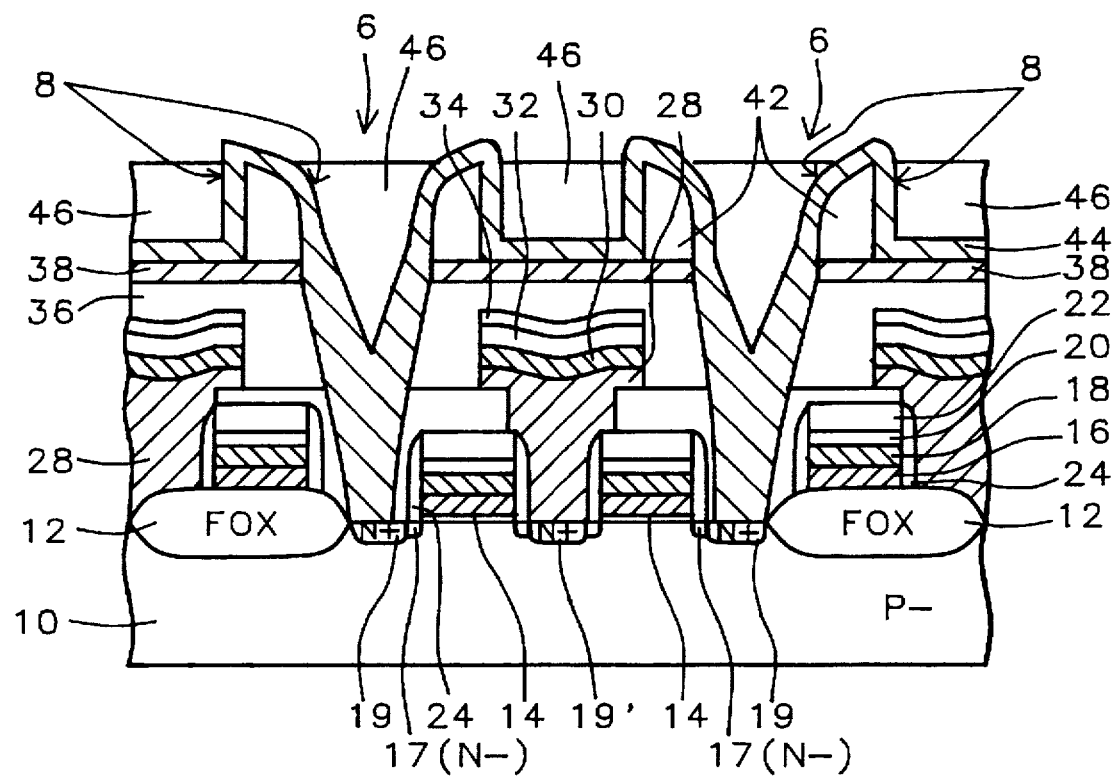

Referring to FIG. 5, a conformal second polysilicon layer 44 is deposited over the free-standing sidewall spacers 42 and in the node contact openings 6 to form node contacts to the second source/drain areas 19 and to form vertical portions 8 of the capacitor bottom electrodes. Preferably layer 44 is deposited by LPCVD using a reactant gas such as $SiH_4$ and is in-situ doped by adding a dopant gas such as arsine ($AsH_3$) or phosphine ($PH_3$) during deposition. Layer 44 is doped to a concentration of between about 1.0 E 19 and 1.0 E 21 atoms/$cm^3$, and is deposited to a thickness of between about 1000 and 1500 Angstroms. A spin-on glass (SOG) layer 46 is deposited by spin coating to provide a planar surface over the sidewall spacers 42. Preferably the SOG is a polysiloxane polymer and is pyrolyzed at a temperature of between about 300° and 500° C. The SOG layer 46 is then etched back by plasma etching to expose the top portions of the second polysilicon layer 44 on the top portions of the sidewall spacers 42. Preferably the etching is carried out in an etchant gas mixture such as $CF_4$, $CHF_3$ and Ar.

Figure 6:
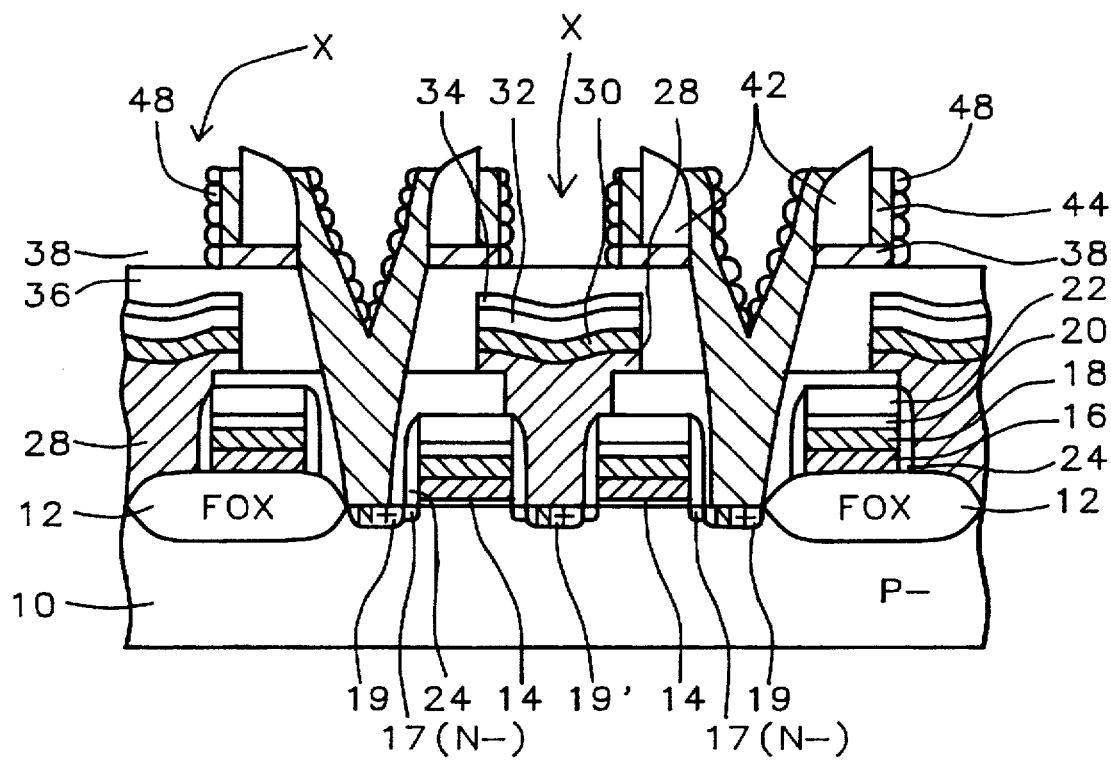

Referring to FIG. 6, the exposed top portions of the second polysilicon layer 44 are etched back to expose the top portions of the sidewall spacers 42. Preferably the polysilicon is removed by reactive plasma etching using, for example, an etchant gas containing chlorine ($Cl_2$). The spin-on glass 46 is now selectively removed exposing the remaining second polysilicon layer 44 that forms portions of the bottom electrodes. The SOG is preferably removed by also plasma etching using an etchant gas mixture, such as $CF_4$, $CHF_3$, and Ar.

Still referring to FIG. 6, a selective anisotropic plasma etch is used to remove the second and first polysilicon layers (layers 44 and 38) in regions X between the adjacent capacitor bottom electrodes, while leaving portions of layer 44 to form the vertical portions of the bottom electrodes for the array of double-crown-shaped stacked capacitors. Preferably the anisotropic plasma etching is carried out in a high-density plasma etcher or by RIE using an etchant gas mixture containing $Cl_2$. The surface of the bottom electrodes (layer 44) can be further increased by roughening. For example, one method is to deposit and to anisotropically etch back a hemispherical silicon grain (HSG) layer 48, such as taught by Koh in U.S. Pat. No. 5,554,557, using a hot-wall vertical LPCVD reactor, and herein incorporated by reference. Preferably the HSG layer 48 is deposited to a thickness of between about 300 and 500 Angstroms. The HSG layer 48 is then anisotropically etched back to form an array of bottom electrodes that are electrically isolated from each other.

Figure 7:
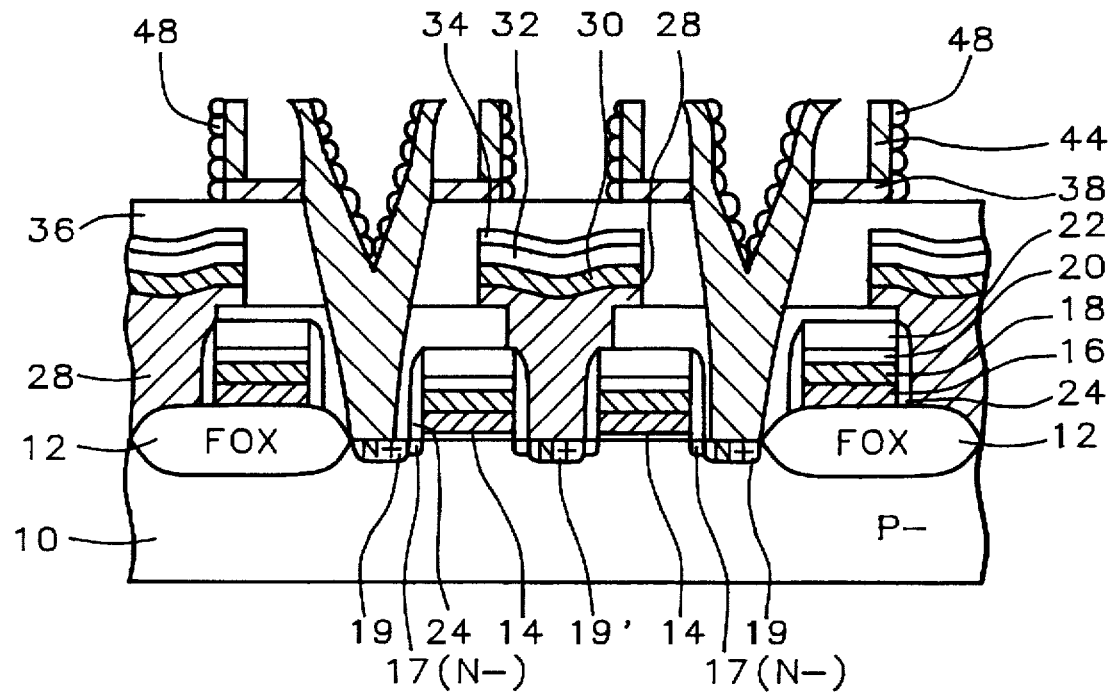

Now as shown in FIG. 7, the silicon nitride sidewall spacers 42 are selectively removed by using a hot phosphoric acid typically at a temperature of about 180° C., while leaving essentially unetched the exposed BPSG second insulating layer 36. This completes the array of bottom electrodes for the capacitors having a double-crown shape that are self-aligned to the node contacts made to the source/drain areas 19($N^+$).

Figure 8:
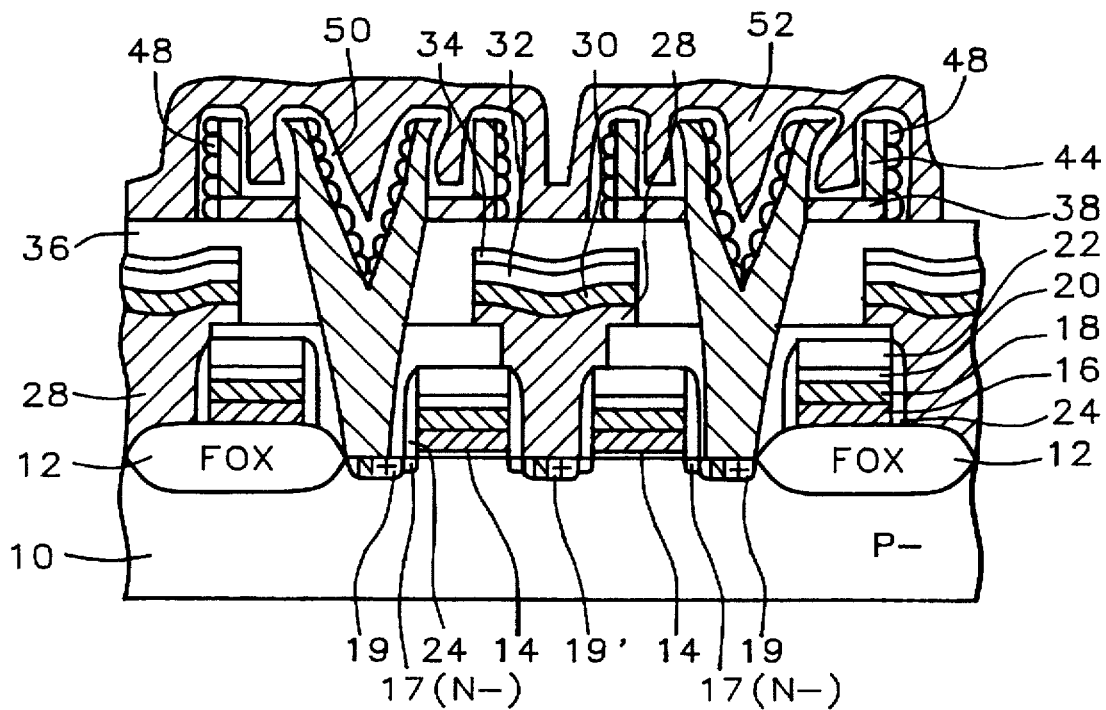

Referring now to FIG. 8, a thin interelectrode dielectric layer 50 is formed on the surface of the array of bottom electrodes. The thin dielectric layer is preferably between about 40 and 100 Angstroms thick, and is composed of a material having a high dielectric constant that is compatible with the polysilicon process and is continuous and pin-hole free. The preferred dielectric layer is composed of silicon oxide-silicon nitride (ON), or a silicon oxide-silicon nitride-silicon oxide (ONO) layer. For example, the surface of the polysilicon bottom electrodes can be thermally oxidized in an oxygen ambient to form the silicon oxide, and then a thin layer of silicon nitride can be deposited using LPCVD to form the ON. To form the ONO layer, the exposed surface of the silicon nitride can be reduced in an oxidizing ambient at elevated temperatures. Alternatively, other insulating materials having a high dielectric constant can be used, such as tantalum pentoxide ($Ta_2O_5$).

Still referring to FIG. 8, a conformal third polysilicon layer 52 is deposited on the interelectrode dielectric layer 50 to complete the array of double-crown-shaped stacked capacitor. Layer 52 conformally covers the bottom electrodes having the interelectrode dielectric on their surface, and forms the top electrodes for storage capacitors. Layer 52 is preferably deposited by LPCVD and is in-situ doped with an N-type impurity, such as with phosphorus (P). The preferred concentration of phosphorus in layer 52 is between about 1.0 E 19 and 1.0 E 21 atoms/$cm^3$. The preferred thickness of polysilicon layer 52 is between about 1000 and 2000 Angstroms. The polysilicon layer 52 is then patterned using conventional photolithographic techniques and plasma etching to form the top electrodes and to complete the double-crown-shaped array of storage capacitors. Only two adjacent capacitors of the array of capacitors are depicted in FIG. 8.

While the invention has been particularly shown and described with reference to the preferred embodiment thereof, it will be understood by those skilled in the art that various changes in form and details may be made without departing from the spirit and scope of the invention.

What is claimed is:

1. A method for fabricating double-crown-shaped stacked capacitors on a semiconductor substrate having device areas, comprising the steps of:

forming on said semiconductor substrate said device areas surrounded and electrically isolated from each other by field oxide areas;

depositing a planar first insulating layer on said substrate;

depositing a planar second insulating layer on said substrate;

depositing a first polysilicon layer on said second insulating layer;

depositing a third insulating layer on said first polysilicon layer;

etching first openings in said third insulating layer to said first polysilicon layer aligned over said device areas;

depositing a conformal fourth insulating layer and anisotropically etching back forming sidewall spacers in said first openings;

etching in said first openings said first polysilicon layer;

anisotropically plasma etching said second and first insulating layers exposed in said first openings to said device areas thereby forming second openings for node contacts, and concurrently etching said third insulating layer to said first polysilicon layer, said first polysilicon layer serving as an etch-stop layer elsewhere over said substrate;

depositing a conformal second polysilicon layer over said sidewall spacers and in said second openings thereby forming capacitor node contacts;

depositing a spin-on glass layer having a planar surface and etching back said spin-on glass layer thereby exposing portions of said second polysilicon layer on top portions of said sidewall spacers;

etching back said exposed portions of said second polysilicon layer on said top portions of said sidewall spacers thereby exposing said sidewall spacers;

selectively removing said spin-on glass layer;

anisotropically etching back, thereby further removing said second and first polysilicon layers to form an array of electrically isolated capacitor bottom electrodes for said stacked capacitors;

selectively removing said sidewall spacers;

forming an interelectrode dielectric layer on said capacitor bottom electrodes;

depositing and patterning a third polysilicon layer thereby forming top electrodes and completing said double-crown-shaped stacked capacitors self-aligned to said capacitor node contacts.

2. The method of claim 1, wherein said substrate further includes field effect transistors (FETs) in said device areas, each of said transistors having a gate electrode formed from a patterned first polycide layer, and having first and second source/drain contact areas, bit lines making electrical contact to said first source/drain contact areas, and said capacitor node contacts making electrical contact to said second source/drain contact areas.

3. The method of claim 1, wherein said first, second, and third polysilicon layers are doped with an $N^+$ type electrically conducting dopant having a concentration of between about 1.0 E 19 and 1.0 E 21 atoms/cm$^3$.

4. The method of claim 1, wherein said first polysilicon layer has a thickness of between about 500 and 1500 Angstroms.

5. The method of claim 1, wherein said second polysilicon layer has a thickness of between about 1000 and 1500 Angstroms.

6. The method of claim 1, wherein said third polysilicon layer has a thickness of between about 1000 and 2000 Angstroms.

7. The method of claim 1, wherein said first and second insulating layers are composed of a planarized borophosilicate glass (BPSG), said first insulating layer having a thickness of between about 1000 and 2000 Angstroms, and said second insulating layer having a thickness of between about 4000 and 9000 Angstroms.

8. The method of claim 1, wherein said third insulating layer is composed of a chemical vapor deposited silicon oxide having a thickness of between about 4000 and 9000 Angstroms.

9. The method of claim 1, wherein said conformal fourth insulating layer is silicon nitride having a thickness of between about 1000 and 2500 Angstroms.

10. The method of claim 1, wherein said capacitor bottom electrodes are roughened by depositing a hemispherical silicon grain (HSG) layer on said bottom electrodes.

11. The method of claim 1, wherein said interelectrode dielectric is formed of silicon oxide/silicon nitride/silicon oxide (ONO) and has a thickness in a range of between about 40 and 100 Angstroms.

12. A method for fabricating an array of dynamic random access memory cells having double-crown-shaped stacked capacitors on a semiconductor substrate comprising the steps of:

forming on said semiconductor substrate device areas surrounded and electrically isolated from each other by field oxide areas;

providing field effect transistors (FETs) in said device areas, each of said transistors having a gate electrode formed from a patterned first polycide layer, and having first and second source/drain contact areas in said device areas;

depositing a planar first insulating layer on said substrate;

photoresist masking and anisotropically etching contact openings to said first source/drain contact areas of each said FET, thereby forming bit line contact openings for bit lines;

forming a second polycide layer on said substrate;

patterning said second polycide layer thereby forming said bit lines to said first source/drain contact areas;

depositing a planar second insulating layer over said bit lines and elsewhere on said substrate;

depositing a first polysilicon layer on said second insulating layer;

depositing a third insulating layer and said first polysilicon layer;

etching first openings in said third insulating layer to said first polysilicon layer aligned over said second source/drain contact areas;

depositing a conformal fourth insulating layer and anisotropically etching back forming sidewall spacers in said first openings thereby reducing a width of said first openings;

etching said first polysilicon layer in said first openings;

anisotropically plasma etching said second and first insulating layers exposed in said first openings to said second source/drain contact areas thereby forming second openings for node contacts, and concurrently etching said third insulating layer to said first polysilicon layer, said first polysilicon layer serving as an etch-stop layer over said bit lines and elsewhere over said substrate;

depositing a conformal second polysilicon layer over said sidewall spacers and in said second openings;

depositing a spin-on glass layer having a planar surface and etching back said spin-on glass layer thereby exposing portions of said second polysilicon layer on top portions of said sidewall spacers;

etching back said second polysilicon layer on said top portions of said sidewall spacers thereby exposing said sidewall spacers;

selectively removing said spin-on glass layer;

depositing a hemispherical silicon grain (HSG) layer and anisotropically etching back, said etching back further removing said second and first polysilicon layers to form an array of electrically isolated capacitor bottom electrodes;

selectively removing said sidewall spacers;

forming an interelectrode dielectric layer on said capacitor bottom electrodes;

depositing and patterning a third polysilicon layer thereby forming top electrodes and completing said double-crown-shaped stacked capacitors.

13. The method of claim 12, wherein said first, second, and third polysilicon layers are doped with an $N^+$ type electrically conducting dopant having a concentration of between about 1.0 E 19 and 1.0 E 21 atoms/cm$^3$.

14. The method of claim 12, wherein said first polysilicon layer has a thickness of between about 500 and 1500 Angstroms.

15. The method of claim 12, wherein said second polysilicon layer has a thickness of between about 1000 and 1500 Angstroms.

16. The method of claim 12, wherein said third polysilicon layer has a thickness of between about 1000 and 2000 Angstroms.

17. The method of claim 12, wherein said first and second insulating layers are composed of a planarized borophosphosilicate glass (BPSG), said first insulating layer having a thickness of between about 1000 and 2000 Angstroms, and said second insulating layer having a thickness of between about 4000 and 9000 Angstroms.

18. The method of claim 12, wherein said third insulating layer is composed of a chemical vapor deposited silicon oxide having a thickness of between about 4000 and 9000 Angstroms.

19. The method of claim 12, wherein said conformal fourth insulating layer is silicon nitride having a thickness of between about 1000 and 2500 Angstroms.

20. The method of claim 12, wherein said interelectrode dielectric is formed of silicon oxide/silicon nitride/silicon oxide (ONO) and has a thickness in a range of between about 40 and 100 Angstroms.

* * * * *